United States Patent [19]

Liu et al.

[11] Patent Number: 5,482,890

[45] Date of Patent: Jan. 9, 1996

[54] METHOD OF FABRICATING QUANTUM DOT STRUCTURES

[75] Inventors: Der-Cherng Liu, Taipei Hsien; Chien-Ping Lee, Hsinchu, both of Taiwan

[73] Assignee: National Science Council, Taipei, Taiwan

[21] Appl. No.: 324,117

[22] Filed: Oct. 14, 1994

[51] Int. Cl.[6] .................................................. H01L 21/203
[52] U.S. Cl. ........................ 437/107; 437/105; 437/126; 437/133
[58] Field of Search .................................... 437/105, 107, 437/126, 129, 133

[56] References Cited

U.S. PATENT DOCUMENTS

| 5,104,824 | 4/1992 | Clausen et al. | 437/126 |
|---|---|---|---|
| 5,229,320 | 7/1993 | Ugajin | 437/107 |
| 5,244,828 | 9/1993 | Okada et al. | 437/107 |
| 5,313,484 | 5/1994 | Arimoto | 437/129 |
| 5,372,675 | 12/1994 | Wakabayashi et al. | 437/126 |

*Primary Examiner*—R. Bruce Breneman
*Assistant Examiner*—Ramamohan Rao Paladugu
*Attorney, Agent, or Firm*—Fish & Richardson

[57] ABSTRACT

A method of fabricating quantum dot structures and devices including the steps of: (i) forming a quantum well membrane on a substrate; (ii) on the quantum well membrane forming a masking layer including a plurality of dot-shaped mask regions which protect the underlying quantum well membrane; (iii) using thermal etching to evaporate portions of the quantum well membrane that are not protected by the dotted mask regions of the masking layer so as to form a plurality of quantum dots; and (iv) after thermal etching, covering the plurality of quantum dots with a layer of material having an energy gap that is greater than the energy gap of the quantum well membrane. The quantum dot produced by this invention is found to generate ten times more illumination than the prior art when measured by photoluminescence.

17 Claims, 3 Drawing Sheets

5,482,890

METHOD OF FABRICATING QUANTUM DOT STRUCTURES

BACKGROUND OF THE INVENTION

The present invention relates to a method of fabricating quantum dot structures, particularly to a method of fabricating quantum dot structures by thermal etching.

A quantum dot is a zero-dimensional quantum structure having a size of about 100 Å. According to quantum mechanical theory, the quantum dot structure should have better optical properties than a quantum well structure. In the quantum well structure, when the growth thickness reaches about 100 Å, quantization effects occur and thus force the electron energy along the growth direction to have discrete energy levels. With rapid growth in epitaxy techniques, high quality quantum well semiconductor materials have been successfully developed into quantum elements such as quantum well lasers, high electron mobility transistors, quantum well infrared detectors, . . . etc.

However, at present there still exists difficulties in applying prior art quantum well structures in practical applications. The major problems lie in the formation of surface states. Generally, the prior art fabrication of quantum dot structures, for example, U.S. Pat. No. 5,229,320 "Method for forming quantum dots" (referring to FIGS. 1a and 1b), uses photolithography and etching techniques on the quantum well structure epitaxy to expose quantum dots 32. This method produces a lot of surface states that are sources of non-radiative recombination centers which lower the optical quality of the quantum dots. Currently, quantum dot structures produce less light intensity than quantum well structures while their optical linewidth is wider than for quantum well structures.

SUMMARY OF THE INVENTION

In view of shortcomings as described above, it is an object of this invention to fabricate quantum dot structures without producing a lot of "surface states" and thereby improve the optical quality of quantum structure.

The procedure of fabricating quantum dot structures according to this invention is as follows:

When a semiconductor is heated to a high temperature, the atoms on its surface will be evaporated at a rate depending on its activation energy. The higher the activation energy is, the slower the evaporation will be. Therefore, if the material with higher activation energy is used to cover some portions of the material with lower activation energy, then after heating and evaporation, the covered portions will pop out as many tiny islands with size of 100 Å. When heated again to high temperature, the quantum dot structures are therefore formed. This method does not involve photolithography, or etching, and therefore it avoids formation of "surface states".

BRIEF DESCRIPTION OF DRAWINGS

The present invention can be more fully understood by reference to the following detailed description and accompanying drawings, which form the integral part of this application, and wherein.

DETAILED DESCRIPTION OF PREFERRED EMBODIMENT

Figure 1A:
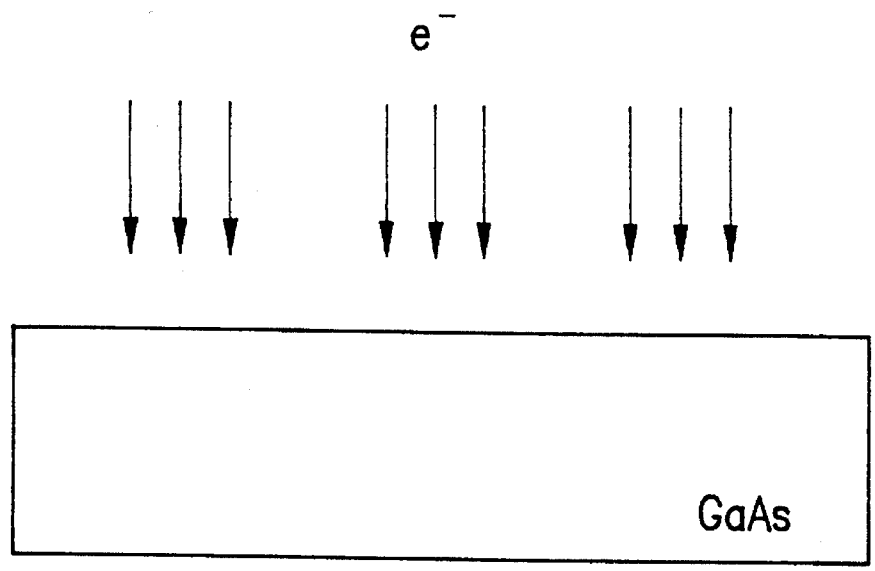
FIGS. 1a and 1b are cross-sectional diagrams of prior art quantum dots structure.
Figure 1B:
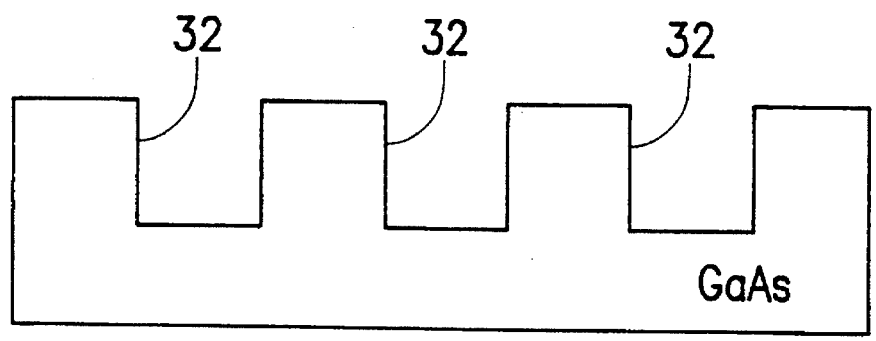
Figure 2A:
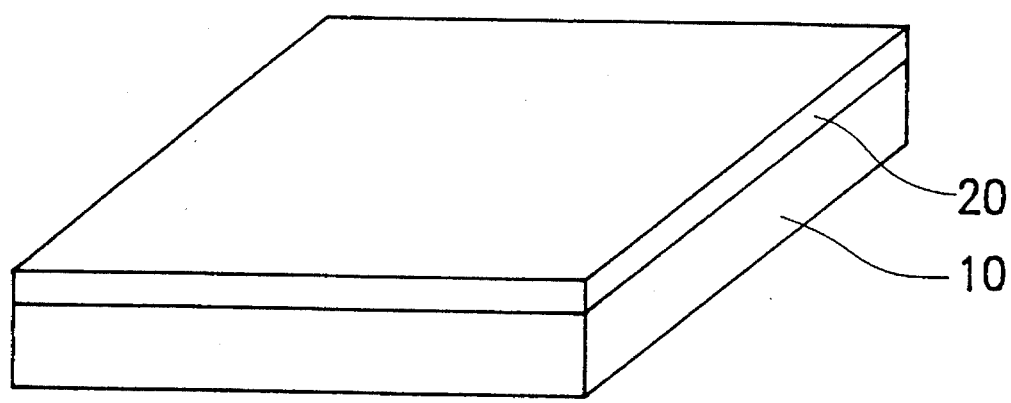
FIGS. 2a–2d are cross-sectional diagrams illustrating the process for fabricating the quantum dot structures of this invention.
Figure 2B:
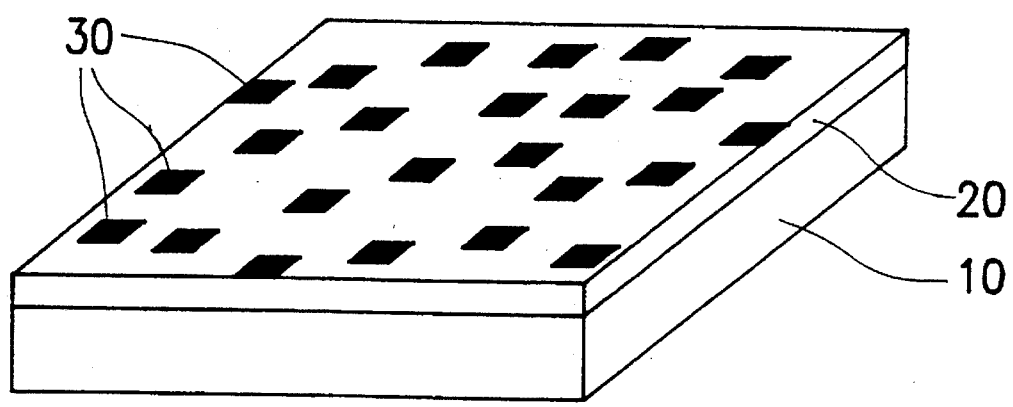
Figure 2C:
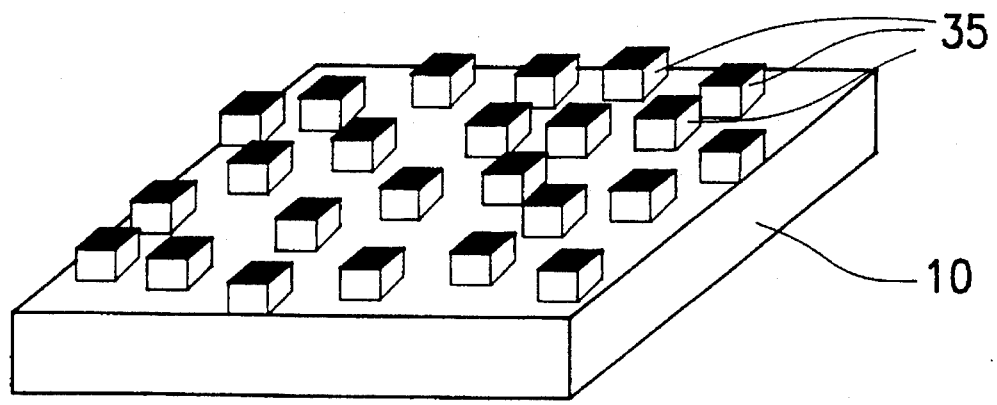
Figure 2D:
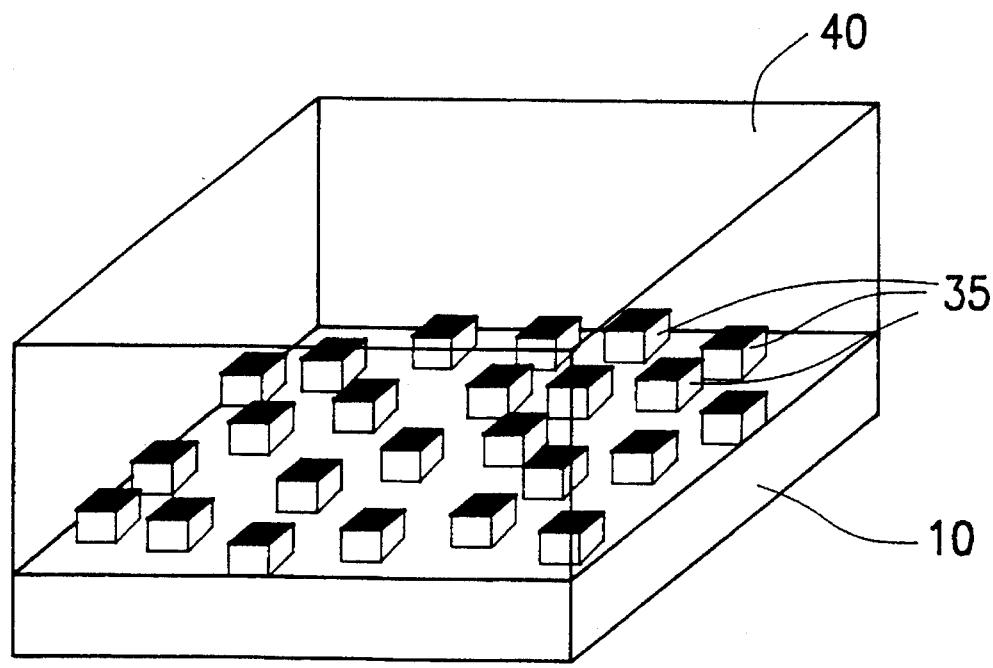

Referring to FIG. 2a to FIG. 2d, the procedure for fabricating quantum dot structures in accordance with the invention comprises the steps of: (1) As shown in FIG. 2a, on a substrate 10 a quantum well layer membrane 20. (2) As shown in FIG. 2b, use "MBE" (molecular beam epitaxy) method to form a masking layer 30 having thickness of about 0.5 atomic layer on the quantum well layer 20. This masking layer 30 has an activation energy that is greater than the activation energy of quantum well layer 20. Because the thickness is half of thickness of the atomic layer, the masking layer 30 cannot evenly cover quantum well layer 20, so "islands" appear. (3) As shown in FIG. 2c, use thermal etching to evaporate the portions of quantum well layer 20 that are left uncovered by the masking layer 30 so as to form a plurality of quantum dots 35. (4) As shown in FIG. 2d, form a semiconductor layer 40 to completely cover the plurality of quantum dots 35 so as to build the quantum dot structures.

As previously stated, the semiconductor substrate 10 and the energy gap of semiconductor layer 40 must be greater than that of quantum dots 35 so the energy of electrons can be confined in the quantum dot structure. For producing masking layer 30, besides the MBE method, there are many choices to choose from, such as migration enhanced epitaxy, chemical beam epitaxy, metal-organic chemical vapor deposition, or metal-organic molecular beam epitaxy. As for the material of masking layer 30, besides semiconductor, metal or ceramic may be considered. The thickness of growth may be from 0.5 atomic layer to 5 atomic layers. As long as the masking layer 30 is not evenly formed, the evaporation must result in a plurality of quantum dots.

In the preferred embodiment of this invention, the substrate 10 is GaAs. A single quantum well formed by a $(In_{0.25}Ga_{0.75})As$ layer of 50 Å thickness is overlaid on the substrate 10. An AlAs layer having thickness of 0.5 atomic layer is overlaid on the $(In_{0.25}Ga_{0.75})As$ layer to be form masking layer. The thermal etching is processed at temperature about 670° C. for 1.5–3 min. Generally speaking, 3 minutes is long enough to evaporate a quantum well layer of $(In_{0.25}Ga_{0.75})As$ that is 50 Å thick. In comparing the thermal etching time duration between 1.5 minutes and 3 minutes, the difference in peak value of energy spectrum is merely 8 meV; while the energy difference between thermal etching for 3 minutes and no etching is 78 meV. In fact, using the quantum dot structures of this invention results in ten to one hundred times more intense radiation than is produced by the quantum structures of the prior art.

The invention has been described above in terms of some important, preferred embodiments; however, this invention is not limited to the disclosed embodiments. On the contrary, for a person skilled in the art, it is intended to cover various modifications and similar arrangements included within the spirit and scope of the appended claims, the scope of which should be accorded the broadest possible interpretation so as to encompass all such modifications and similar structures and processes.

What is claimed is:

1. A method of fabricating quantum dot structures and devices comprising the steps of:

(i) forming a quantum well layer on a substrate;

(ii) forming a masking layer on the quantum well layer to thereby produce a plurality of dot-shaped mask regions which protect underlying portions of the quantum well layer;

(iii) using thermal etching to evaporate portions of the quantum well layer that are not protected by the dot-shaped mask regions of the masking layer so as to form a plurality of quantum dots; and (iv) after thermal etching, forming on the plurality of quantum dots a layer of material having an energy gap that is greater than the energy gap of the quantum well layer.

2. The method of claim 1 wherein the activation energy of the masking layer is greater than the activation energy of the quantum well layer.

3. The method of claim 2 wherein the substrate is a semiconductor.

4. The method of claim 3 wherein the masking layer is a semiconductor.

5. The method of claim 4 wherein the thickness of the masking layer is greater than about 0.5 atomic layers.

6. The method of claim 3 wherein the semiconductor substrate is GaAs.

7. The method of claim 6 wherein the thickness of the quantum well layer is about 50 Å.

8. The method of claim 6 wherein the material of the quantum well layer is $(In_{0.25}Ga_{0.75})As$.

9. The method of claim 8 wherein the material of the masking layer is AlAs.

10. The method of claim 9 wherein the masking layer is between about 0.5 to about 5 atomic layers thick.

11. The method of claim 1 wherein the step of forming the masking layer comprises using MBE (molecular beam epitaxy).

12. The method of claim 9 wherein thermal etching is performed at a temperature of about 670° C. for 1.5 to 3 minutes.

13. The method of claim 1 wherein the substrate has an energy gap that is greater than the energy gap of the quantum well layer.

14. The method of claim 1 wherein the masking layer is a semiconductor.

15. The method of claim 14 wherein the activation energy of the masking layer is greater than the activation energy of the quantum well layer.

16. The method of claim 15 wherein the step of forming the masking layer comprises using MBE (molecular beam epitaxy).

17. The method of claim 15 wherein the substrate has an energy gap that is greater than the energy gap of the quantum well layer.

* * * * *